(12) United States Patent
Lee et al.

(10) Patent No.: US 6,724,661 B2
(45) Date of Patent: Apr. 20, 2004

(54) ERASING METHOD IN NON-VOLATILE MEMORY DEVICE

(75) Inventors: Yong-Kyu Lee, Kyunggi-do (KR); Dong-Jun Kim, Kyunggi-do (KR); Min-Soo Cho, Sungnam-shi (KR); Eui-Youl Ryu, Daejon (KR); Jin-Ho Kim, Seoul (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 10/090,902

(22) Filed: May 31, 2002

(65) Prior Publication Data

US 2003/0016561 A1 Jan. 23, 2003

(30) Foreign Application Priority Data

Jun. 21, 2001 (KR) .......................... 2001-35424

(51) Int. Cl.$^7$ .............................................. G11C 16/04
(52) U.S. Cl. .......................... 365/185.29; 365/185.18; 365/185.33
(58) Field of Search ...................... 365/185.29, 185.19, 365/185.01, 185.05, 185.16, 185.27, 185.33

(56) References Cited

U.S. PATENT DOCUMENTS

| 4,884,239 A | * | 11/1989 | Ono et al. ............. 365/185.27 |
| 5,629,893 A | * | 5/1997 | Tang et al. ............. 365/185.29 |
| 5,650,964 A | * | 7/1997 | Chen et al. ............. 365/185.25 |
| 5,751,636 A | * | 5/1998 | Naruke et al. ......... 365/185.29 |
| 6,243,298 B1 | * | 6/2001 | Lee et al. ............. 365/185.28 |

* cited by examiner

Primary Examiner—Gene Auduong
(74) Attorney, Agent, or Firm—F. Chau & Associates, LLC

(57) ABSTRACT

A method for performing an erase operation in a memory cell. A first voltage and a second voltage are applied to the source and drain regions, respectively, for a predetermined erase time; and the first and second voltages are switched with each other between the source and drain regions at least one time for the erase time. Thereby, hole is easily injected to the source and drain regions and a channel lateral surface, and a uniform and high-speed erase operation is archived.

14 Claims, 9 Drawing Sheets

ERASING METHOD IN NON-VOLATILE MEMORY DEVICE

CROSS-REFERENCE TO RELATED APPLICATION

This application claims priority to Korean Patent Application No. 2001-35424, filed on Jun. 21, 2001, which is commonly owned and incorporated by reference herein.

BACKGROUND

1. Technical Field

The present invention relates to a semiconductor memory device and, more particularly, to a method for an erase operation in a non-volatile semiconductor memory device.

2. Description of Related Art

Generally, non-volatile electrically erasable and programmable read only memories (EEPROMs) are classified into floating gate EEPROMs and polysilicon-blocking oxide-silicon nitride-tunnel oxide-semiconductor (SONOS) EEPROMs.

EEPROMs store data in a floating gate of polysilicon or entrap data in a nitride layer while increasing or decreasing a threshold voltage to perform a program (or write) operation. When reading the stored data, EEPROMs use a sensing circuit to apply a read voltage (Vr) and sense a current flowing to a channel. Also, to perform an erase operation, EEPROMs remove the stored data in the polysilicon or the nitride layer.

In SONOS EEPROMs, a read operation is performed when stored data is varied. Accordingly, the stored data must be completely removed throughout a channel to secure reliability of the device. Otherwise, the read and erase operations are repeatedly performed to accumulate data continuously, and the read operation can be erred by the varying of a threshold voltage.

FIG. 1 is a cross-sectional view showing a memory cell according to a conventional program method in a SONOS EEPROM device. FIG. 2 shows a memory cell according to a conventional erase method in a SONOS EEPROM device. FIG. 3A shows a memory cell according to another conventional erase method in a SONOS EEPROM, and FIG. 3B illustrates a waveform of the voltages applied to the memory cell of FIG. 3A. In FIG. 3B, a traverse axis represents time (t), and a longitudinal axis represents applied voltages.

Referring to FIG. 1, a memory cell 50 comprises a P-type bulk region 10, spaced drain and source regions 12, 14 formed in the P-bulk region 10, a channel region 13 formed between the drain and source regions 12, 14, an ONO layer 22 (comprising a tunnel oxide 16, a nitride 18, and a blocking oxide 20 layer) formed on the channel region 13, and a polysilicon gate electrode 24 formed on the ONO layer 22. To program the memory cell, the drain and source regions 12, 14 and the P-bulk region 10 are grounded through a metal contact and a program voltage Vpp is applied to the gate electrode 24. And, electrons are entrapped in the nitride layer 18 through a thin tunnel oxide layer 16 by F-N tunneling (Follower-Nordheim tunneling).

In a conventional erase method shown in FIG. 2, a negative program voltage −Vpp is applied to a gate electrode 24 with the drain and source regions 12, 14 and a P-bulk region 10 being grounded. Holes are then injected from the P-bulk region 10 to a tunnel oxide layer 16 and a nitride layer 18, compensating the entrapped electrons in the program operation to perform the erase operation.

Unfortunately, it is difficult to form and apply the negative voltage −Vpp to the gate electrode 24.

A memory cell according to another conventional erase method, shown in FIG. 3A, further comprises a pocket P-well 11 formed in the N-bulk region 10. In an erase operation, the gate electrode 24 is grounded, and an erase voltage Vpp is applied to the drain and source regions 12, 14, the pocket P-well 11, and the N-bulk region 10 through a metal contact. The applied voltages are schematically shown in FIG. 3B. One disadvantage associated with the memory device in FIG. 3A is that the pocket P-well 11 must separately be formed, thus increasing the complexity and processing costs.

Although not shown in FIGS. 1–3, another conventional erase method can be performed by grounding a gate electrode and the bulk region, and equivalently applying an erase voltage to source and drain regions. In the erase method, a high-energy hole (so-called "hot hole"), formed at both sides (i.e., source and drain regions) of a channel, is vertically injected through a source region-to-gate electrode junction side and a drain region-to-gate electrode junction side. However, the erase method cannot fully perform the erase operation at the center of the channel. Therefore, the entrapped electrons are not removed and are continuously accumulated in a nitride layer over the channel center. As a result, a threshold voltage is heightened and a sensing margin is reduced.

Thus, a need exists for a circuit framework that generates a negative voltage without occupying additional area in a semiconductor device.

SUMMARY OF THE INVENTION

It is therefore an object of the present invention to provide an efficient erase method in a non-volatile semiconductor memory device capable of achieving a reliable erase operation throughout a channel region, which does not require applying a negative voltage or performing a pocket well process.

According to one aspect of the present invention, a non-volatile memory device is provided which enables an effective erase operation according to the invention. The device comprises a bulk region of a first conductive type, spaced first and second impurity diffusion regions of a second conductive type formed in the bulk region, a charge storing layer formed between the first and the second impurity diffusion regions, and a conductive electrode formed on the charge storing layer. The method for performing an erase operation in the non-volatile memory device comprises the steps of: applying a bulk voltage to the bulk region for a predetermined erase time; applying a gate voltage to the conductive electrode for the predetermined erase time, the gate voltage being greater than or equal to the bulk voltage; applying a first electrical signal to the first impurity diffusion region for the predetermined erase time, the first electrical signal comprising a voltage that is greater than the gate voltage; and applying a second electrical signal to the second impurity diffusion region for the predetermined erase time, the second electrical signal comprising a voltage that is greater than the gate voltage, wherein the voltage of the first electrical signal is different from the voltage of the second electrical signal.

The voltage level of the first electrical signal is switched between a first voltage and a second voltage at least one time, during the predetermined erase time, wherein the first and second voltages are greater than the gate voltage. The second electrical signal is substantially equal to the first and second voltages when the first electrical signal is substantially equal to the second and the first voltages, respectively for the predetermined erase time. For example, the first voltage ranges from about 2V to about 6V, and the second voltage is about 10V.

According to another aspect of the present invention, a method for performing an erase operation in a memory cell, comprising a bulk region of a first conductive type, spaced source and drain regions of a second conductive type formed in the bulk region, and a gate electrode formed between the source and drain regions is provided. The method comprises the steps of: applying a first voltage to the source region and a second voltage to the drain region for a portion of a predetermined erase time; and applying the second voltages to the source region and the first voltage to the drain region for a portion of the predetermined erase time.

According to further aspect of the present invention, a method for performing an erase operation in a non-volatile memory device, comprising a bulk region of a first conductive type, spaced source and drain regions of a second conductive type formed in the bulk region, and a gate electrode formed between the source and drain regions, is provided. The method comprises the steps of: applying a first voltage and a second voltage to the source and drain regions, respectively, for a predetermined erase time; applying a third voltage to the gate electrode, wherein the potential differences between the third voltage and the first and second voltages are sufficient to generate electric fields between the gate electrode and the source and drain regions to inject holes into the source and drain regions, respectively; and switching the first voltage to the drain region and the second voltage to the source region at least one time during the predetermined erase time.

Advantageously, according to the present invention, by applying and switching different voltage levels to source and drain regions, respectively for predetermined erase time, hole is easily injected into the source and drain regions, and a channel lateral surface. Therefore, it is possible to achieve uniform and high-speed erase operation.

These and other objects, aspects, features, and advantages of the present invention will become apparent from the following detailed description of preferred embodiments, which is to be read in connection with the accompanying drawings.

DESCRIPTION OF PREFERRED EMBODIMENTS

The present invention relates to methods for erasing data in a non-volatile memory device. Although preferred embodiments of the present invention are described using a SONOS EEPROM device, it is understood that the present invention can be applied to a floating gate EEPROM device. Also, notwithstanding that an N-channel of the SONOS EEPROM device is described, the present invention is equally applicable to P-channel structures without departing from the spirit of the present invention.

Figure 1:
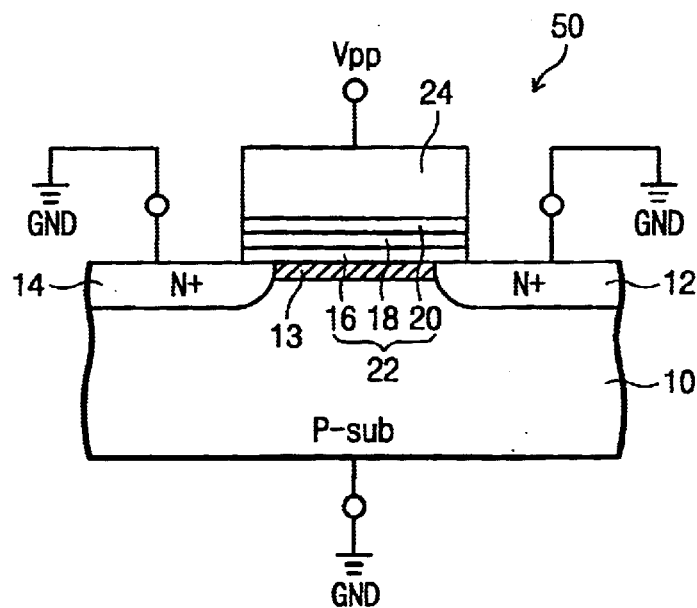
FIG. 1 is a cross-sectional view of a memory cell for performing a conventional program method in an EEPROM.
Figure 2:
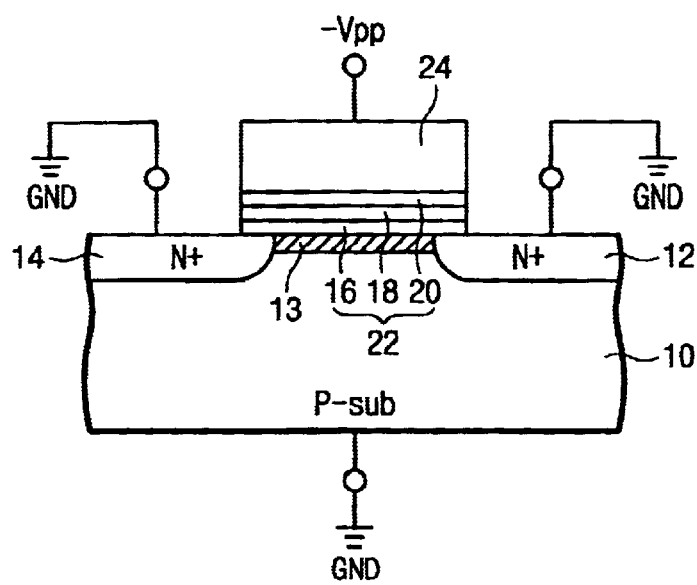
FIG. 2 is a cross-sectional view of a memory cell for performing a conventional erase method in an EEPROM.
Figure 3A:
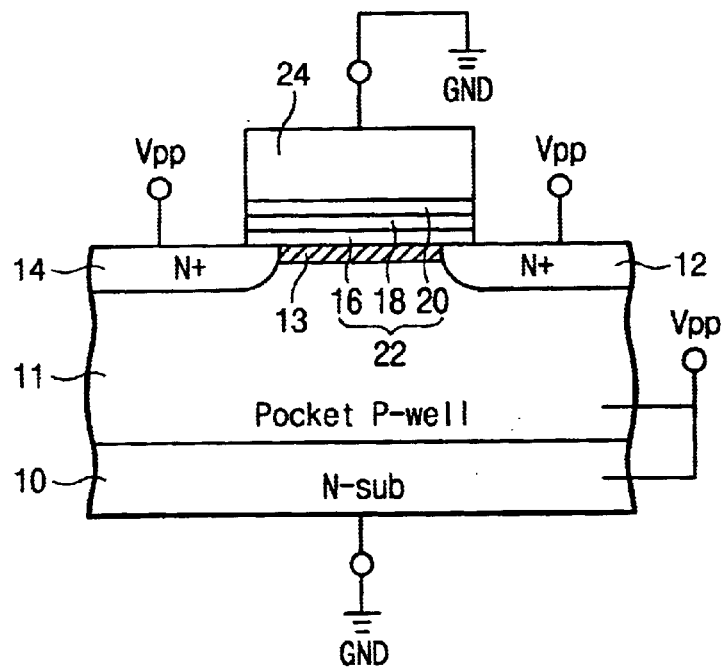
FIG. 3A is a cross-sectional view of a memory cell for performing another conventional erase method in an EEPROM.
Figure 3B:
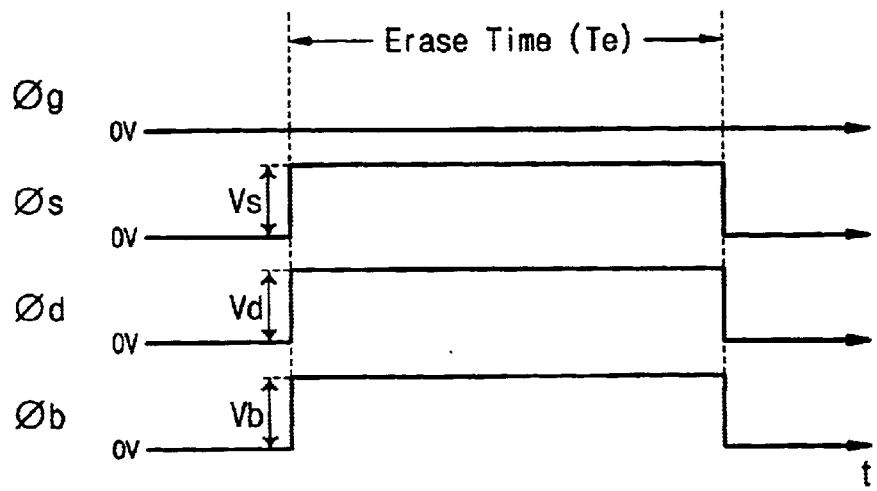
FIG. 3B is a diagram showing voltage waveforms that are applied to the memory cell of FIG. 3A to perform a conventional erase operation.
Figure 4A:
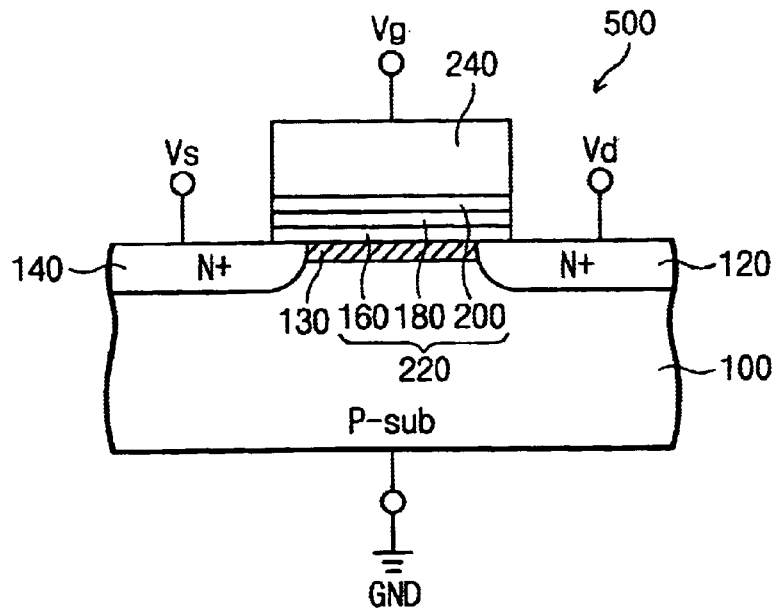
FIG. 4A is a cross-sectional view showing a memory cell for performing an erase operation according to one aspect of the invention.

Referring to FIG. 4A, an erase voltage is applied to a programmed memory cell transistor 500 of a SONOS EEPROM device. The memory cell transistor 500 comprises a P-type bulk region 100, spaced first and second impurity diffusion regions 120 and 140 formed in the P-type bulk region 100, an N-type channel region 130 formed between the impurity diffusion regions 120 and 140, a charge storing layer 220 (which comprises a tunnel oxide layer 160, a storage storing nitride layer 180, and a blocking oxide layer 200) formed on the N-type channel region 130, and a conductive electrode 240 formed on the charge storing layer 220. The first and second impurity diffusion regions 120 and 140 comprise drain and source regions, respectively, and are formed by implanting N-type impurities into the P-type bulk region 100. The conductive electrode 240 comprises a polycide gate electrode. A metal contact is formed in the P-type bulk region 100, so that the memory cell transistor 500 in a SNONOS EEPROM device has four terminals.

In a program operation, the bulk region 100, the drain region 120, and the source region 140 are grounded and a program voltage Vpp is applied to the gate electrode 240. Then, electrons are entrapped in the charge storing nitride layer 180 through the tunnel oxide layer 160 by F-N tunneling, increasing a threshold voltage of the cell transistor. On the other hand, in a floating gate EEPROM device, the charge storing layer 220 comprises a tunnel oxide layer, a floating gate layer, and a dielectric layer, and charges are stored in the floating gate layer.

An erase method according to one embodiment of the invention will now be described in further detail. Unlike a conventional method, the present invention does not require a separate pocket well process and a negative voltage applied to a gate. Instead, a bulk voltage Vb of about 0V is applied to the bulk region 100 (i.e., the bulk region 100 is grounded), and a gate voltage Vg of about 0V or higher voltage is applied to a gate electrode 240. Drain and source voltages Vd and Vs (which are higher than the gate voltage Vg) are applied to the drain and source regions 120 and 140, respectively. Preferably, the drain and source voltages Vd and Vs are different from each other in magnitude.

It is preferable that the gate voltage Vg is grounded for easy injection of a hot hole. This is because a hot hole is easily injected when the potential differences between is the gate voltage Vg and the source voltage Vs, and between the gate voltage Vg and the drain voltage Vd are, high. For instance, a negative voltage may be applied to a gate electrode for higher potential difference.

In an embodiment of the present invention, with an N-type channel, relative voltage levels are as follows: drain voltage Vd>source voltage Vs>gate voltage Vg≧bulk voltage Vb, or source voltage Vs>drain voltage Vd>gate voltage Vg≧bulk voltage Vb. Further, and more preferably, the drain voltage Vd and the source voltage Vs may be switched with each other. The drain voltage Vd and the source voltage Vs are varied with a resisting pressure characteristic of a P-N junction (which is formed between an N-type source region and a drain region on a P-type bulk region). For example, if the P-N junction has a resisting characteristic of about 12V, a drain voltage is about 10V, a source voltage is about 2V–6V, and a gate voltage is grounded. Therefore, intensities of applied voltages can be controlled by a resisting pressure characteristic of a P-N junction.

Figure 4B:
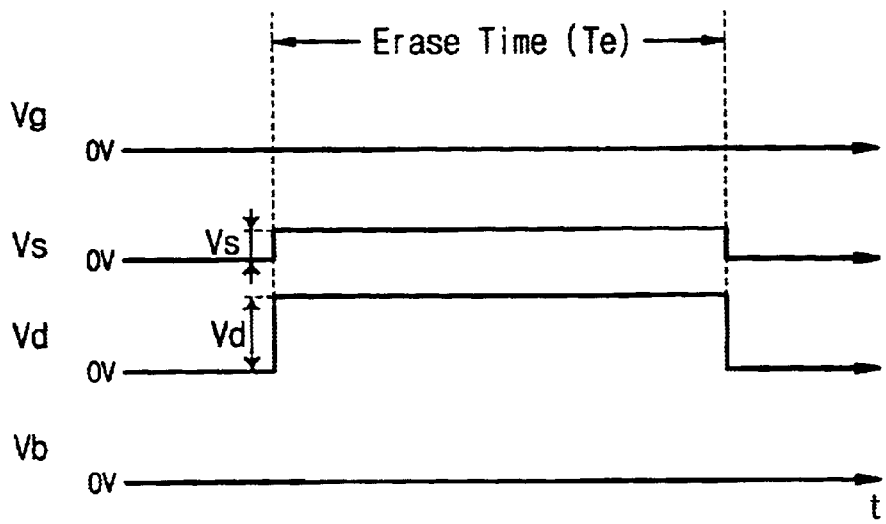
FIG. 4B is a diagram showing voltage waveforms that are applied to the memory cell of FIG. 4A for performing an erase operation according to one aspect of the invention.
Figure 4C:
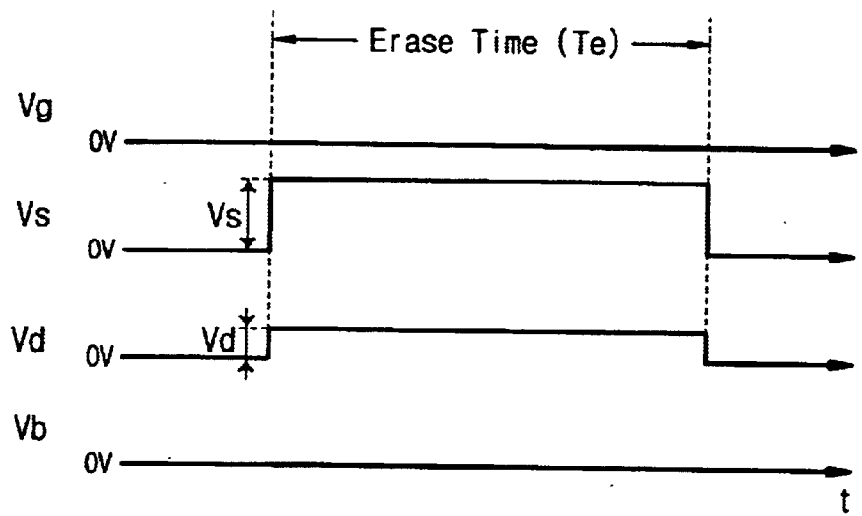
FIG. 4C is a diagram showing voltage waveforms that are applied to the memory cell of FIG. 4A for performing an erase operation according to another aspect of the invention.

In FIG. 4B, a traverse axis (or X-axis) represents an erase time (Te) of voltages applied to each terminal, and a longitudinal axis (Y-axis) represents intensities of the applied voltages. As shown in FIG. 4B, a gate voltage Vg and a bulk voltage Vb are maintained at about 0V (grounded). For predetermined erase time (Te), a source voltage Vs is about 4V (which is higher than the gate voltage Vg), and a drain voltage Vd is about 10V (which is higher than the gate voltage Vg). In another embodiment of the present invention, a drain voltage Vd may be switched with a source voltage Vs. For example, as shown in FIG. 4C, a source voltage Vs is about 10V and a drain voltage Vd is about 4V for the erase time Te.

Figure 4D:
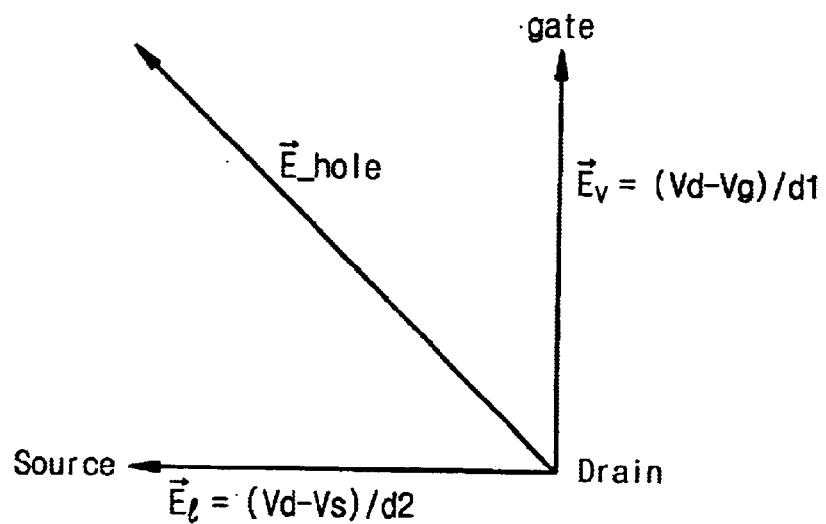
FIG. 4D is a graph showing hole injecting directions based on the applied voltages of FIG. 4B.

In this embodiment, the source voltage and the drain voltage are different from each other. When the drain voltage Vd is higher than the source voltage Vs, as shown in FIG. 4B, electric fields ($\vec{Ev}$) are generated between a gate electrode 240 and a drain region 120 and electric fields ($\vec{El}$) are generated between the drain region 120 and a source region 140, as shown in FIG. 4D. The $\vec{Ev}$ and the $\vec{El}$ are followings: $\vec{Ev}=(Vd-Vg)/d1$ (wherein, d1 is a distance between a gate electrode and a drain region); and $\vec{El}=(Vd-Vs)/d2$ (wherein, d2 is a distance between a source region and a drain region). Because of these electric fields, a hot hole (which is created at a drain region) has not only a vertical element between a drain region and a gate electrode, but also a horizontal element between the drain region and a source region (i.e., a horizontal direction along a channel). Thus, a hole is injected according to a direction based on a vector sum of the two elements ($\vec{E}$ hole=$\vec{Ev}+\vec{El}$). Accordingly, an erase operation is effectively performed throughout the channel region.

Figure 5A:
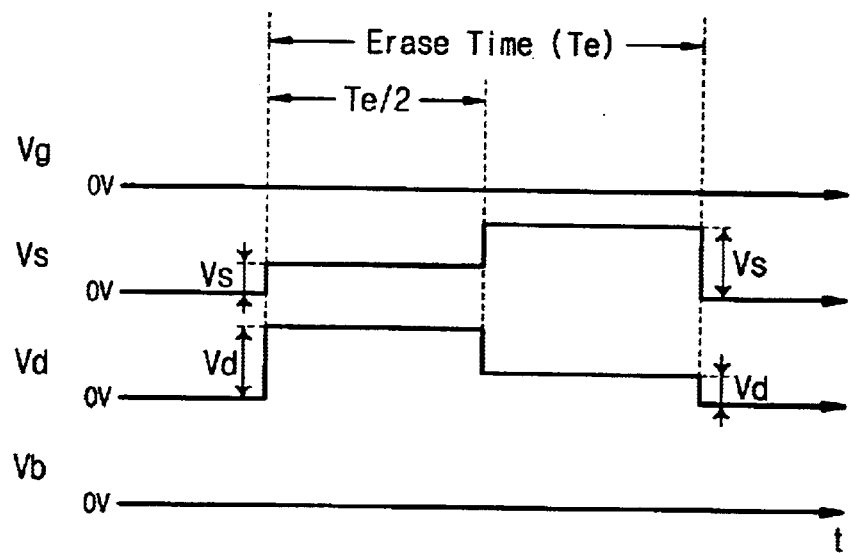
FIG. 5A is a diagram showing voltage waveforms that are applied to the memory cell of FIG. 4A for performing an erase operation according to another aspect of the invention.

More preferably, a drain voltage Vd and a source voltage Vs are switched at least one or more times during an erase time (Te). For example, as shown in FIG. 5A, a drain voltage Vd is about 10V and a source voltage Vs is about 4V for a predetermined time (e.g., Te/2), and the voltages Vd and Vs are switched with each other for the remaining time (Te/2), wherein the drain voltage Vd is about 4V and the source voltage Vs is about 10V. Furthermore, as shown in FIG. 5D, a higher voltage (>10V) may be applied to the source voltage Vs and a lower voltage (<4V) may be applied to the drain voltage Vd for a predetermined time (Te/2), and vice versa for the remaining time (Te/2). It is to be understood that these voltage levels and switching times are for purposes of illustration and that persons skilled in the art can modify the switching time of a source voltage and a drain voltage and the magnitude of the voltages. For example, the first switching time and the second switching time may be different from each other. Furthermore, the total switching time may be longer than the erase time (Te).

Figure 5B:
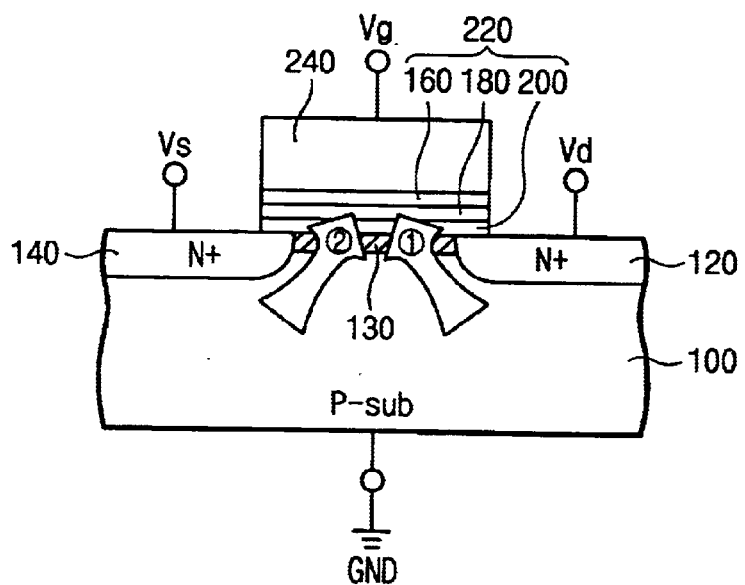
FIG. 5B is a cross-sectional view of a memory cell showing hole injection directions based on the applied voltages of FIG. 5A.

FIG. 5B shows hole-injecting directions in source and drain regions when applied voltages are switched between the source region and the drain region. An arrow ① illustrates a hole injecting direction when a higher voltage is applied to a drain region, and an arrow ② illustrates a hole injecting direction when a higher voltage is applied to a source region. As a result, a uniform erase operation can be performed throughout a channel by switching the voltages applied to source and drain regions. This is because holes are injected to a channel side direction by an electric field formed between the source and drain regions.

Figure 5C:
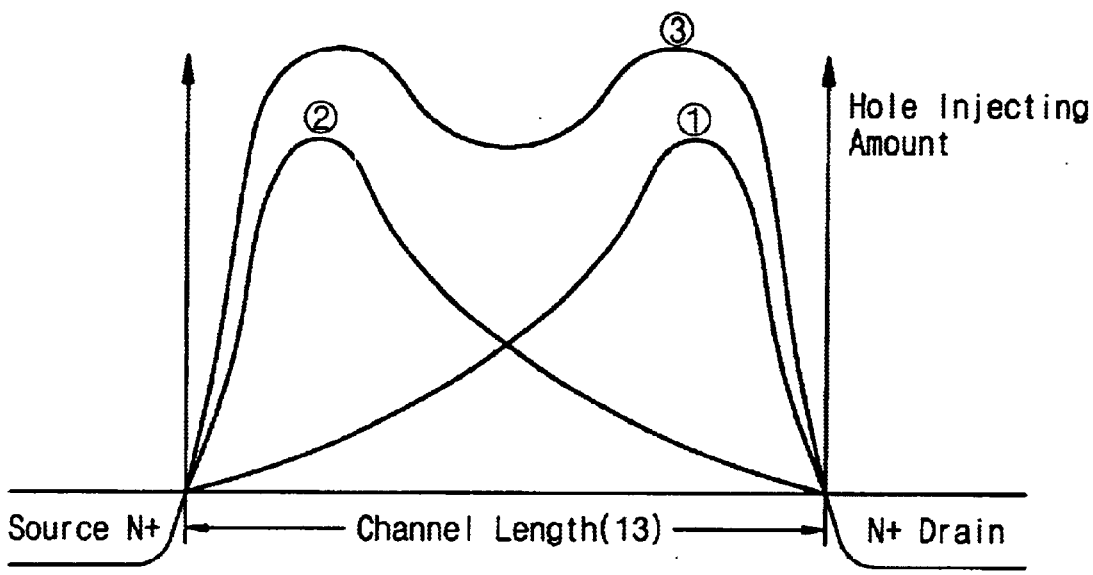
FIG. 5C is a graph showing an amount of injected holes of FIG. 5B as a function of source and drain voltages and channel length.
Figure 5D:
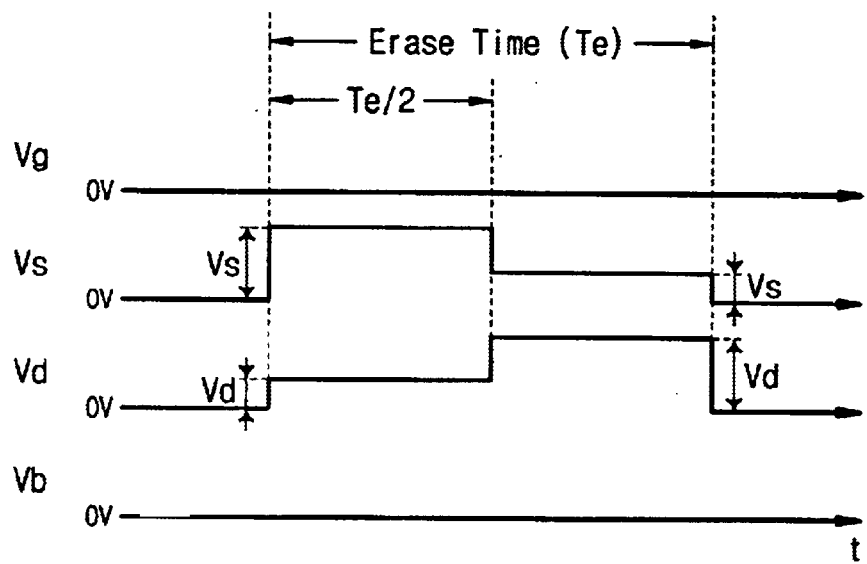
FIG. 5D is a diagram showing voltage waveforms that are applied to the memory cell of FIG. 4A for performing an erase operation according to another aspect of the invention.

FIG. 5C illustrates a relationship between an amount of injected holes and a channel length, wherein a traverse axis represents a channel length, and a longitudinal axis represents an amount of injected holes. If a higher voltage is applied to a drain region, relatively more amount of holes is injected into the drain region (as shown by line ①). If a higher voltage is applied to a source region, relative more amount of holes is injected into the source region (as shown by line ②). Thus, if applied voltages are switched between the source region and the drain region, the total of amounts of holes in the source and drain regions leads to uniform hole injection throughout the entire channel region (as shown by line ③).

Figure 6A:
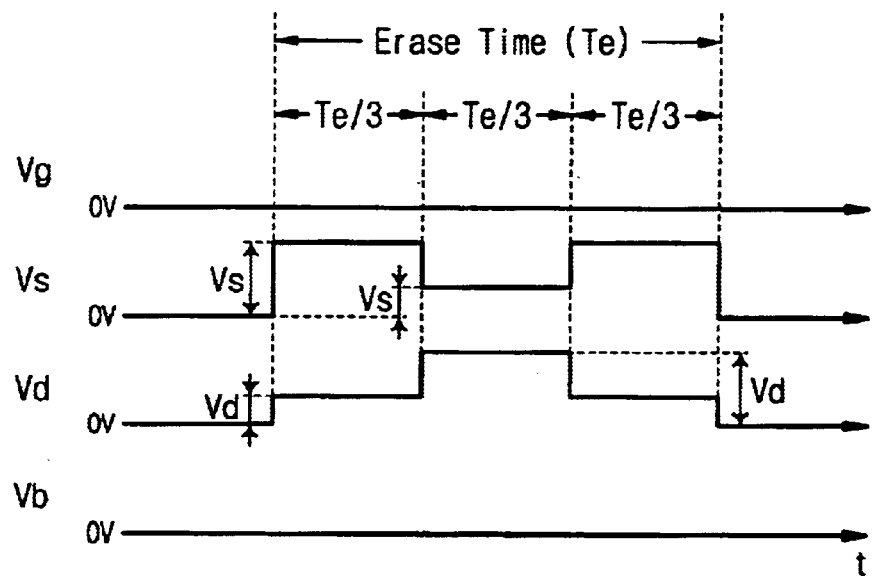
FIGS. 6A and 6B are diagrams showing voltage waveforms that are applied to the memory cell of FIG. 4A for performing erase operations according to further aspects of the invention.
Figure 6B:
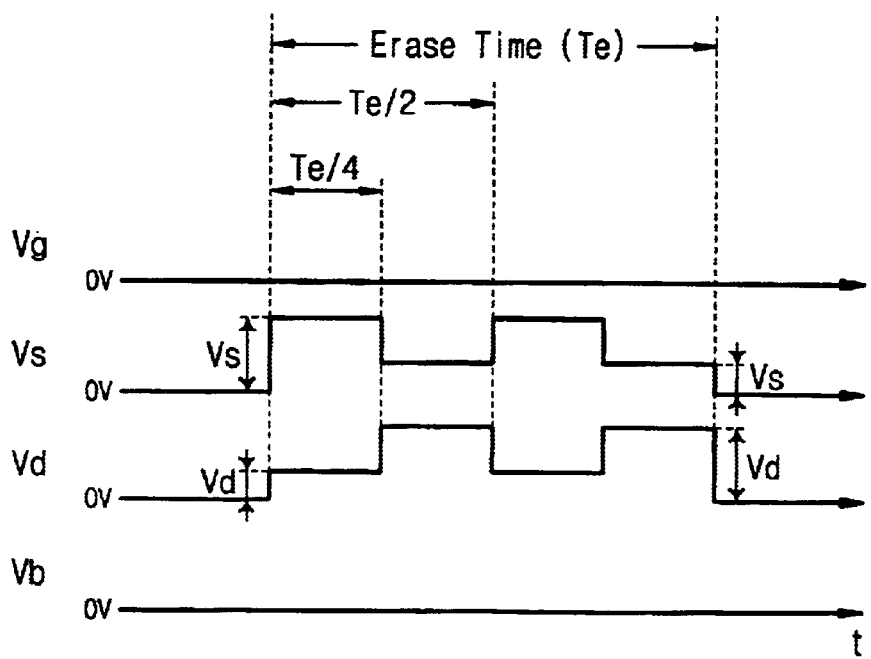

FIGS. 6A and 6B are diagrams showing voltage waveforms that are applied to the device in FIG. 4A to perform erase operations according to other embodiments of the present invention. For example, in FIG. 6A, voltages of source and drain regions are switched twice (e.g., the voltages are switched every Te/3). Although, a higher voltage is initially applied to the source region, the higher voltage may initially be applied to the drain region. Further, in FIG. 6B, voltages of source and drain regions are switched four times (e.g, the voltages are switched every Te/4). As mentioned above, in other embodiments, switching times may be different from each other, and the total switching time may be longer than an erase time Te.

Figure 7:
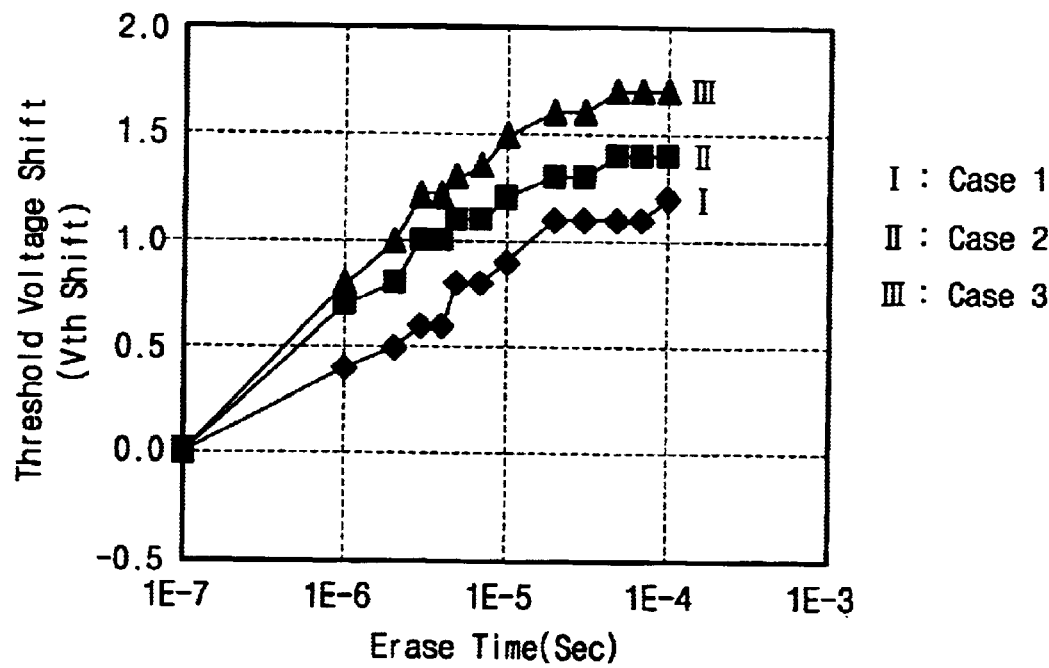
FIG. 7 is a graph comparing the relationship between a threshold voltage shift and erase time between a conventional erase method and an erase method of the invention.

FIG. 7 is a graph showing the relationship between erase time and a threshold voltage shift according to a conventional erase method and an erase method of the present invention. The threshold voltage shift is a threshold voltage change between a program operation and an erase operation. In general, a program operation is performed by applying 11V to a gate electrode, applying 6V to a drain region, and grounding a source region and a bulk region. The gate electrode is preferably made of polycide having a thickness of about 2000 Å. An ONO layer comprises an oxide-nitride-oxide stacking layer each having a thickness of 80 Å.

Arsenic (As) is implanted into the source and drain regions by 60 keV with a dose of 5×10$^{15}$ atoms/cm$^2$, and into a channel region by 60 keV with a dose of 1.0×10$^{12}$ atoms/cm$^2$. In FIG. 7, a traverse axis (or X-axis) represents an erase time (second), and a longitudinal axis (or Y-axis) represents a variation of a threshold voltage (volt).

Reference symbol "I" represents a conventional erase method, wherein a bulk region and a gate electrode are grounded, and 10V is applied to source and drain regions for a predetermined time ("case 1"). Reference symbols "II" and "III" represent erase methods according to the present invention. With symbol "II", as shown in FIG. 4B, a bulk region and a gate electrode are grounded, 4V is applied to a source region, and 10V is applied to a drain region for the identical erase time ("case 2"). With symbol "III", 10V/4V and 4V/10V are applied to source and drain regions under the same condition as case 2, for half of an erase time (Te/2), respectively ("case 3"). As shown in FIG. 7, a threshold voltage shift of the present invention ("case 2" or "case 3") is greater that that of the conventional method (case 1). That is, a threshold voltage shift in applying different voltages to source and drain regions is greater than that in applying the same voltage to the source and drain regions. Advantageously, when voltages of the source and drain regions is switched with each other, a better result can be obtained.

Figure 8A:
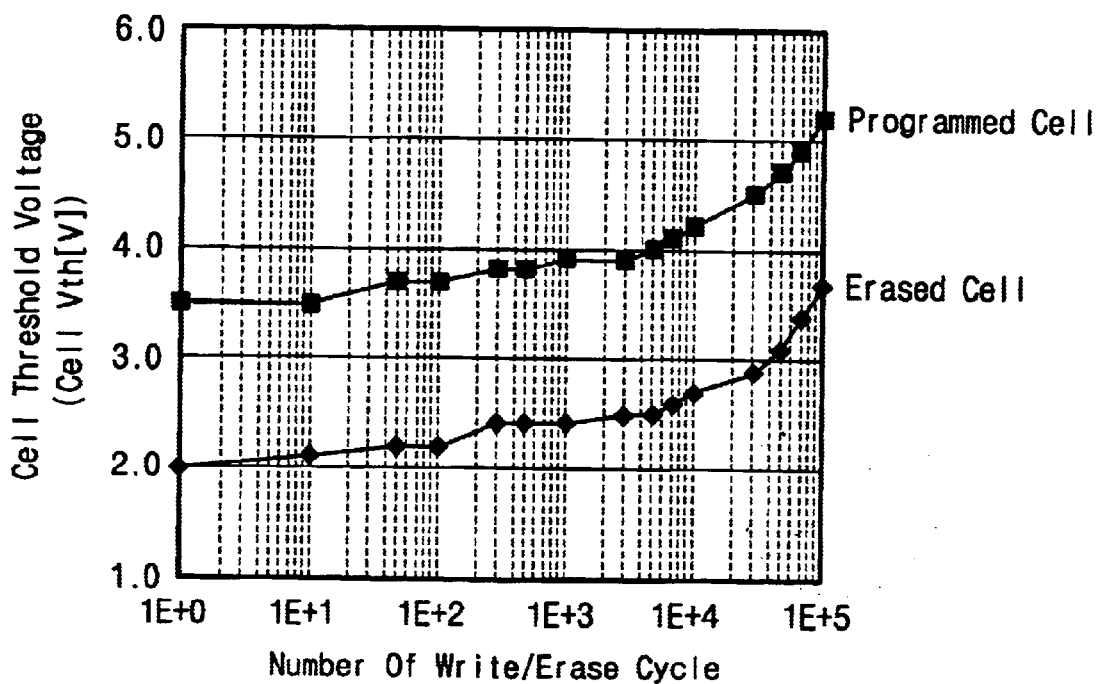
FIGS. 8A through 8C are graphs comparing the relationship between an endurance characteristic and the number of write/erase cycle between a conventional erase method and an erase method of the invention, respectively.
Figure 8B:
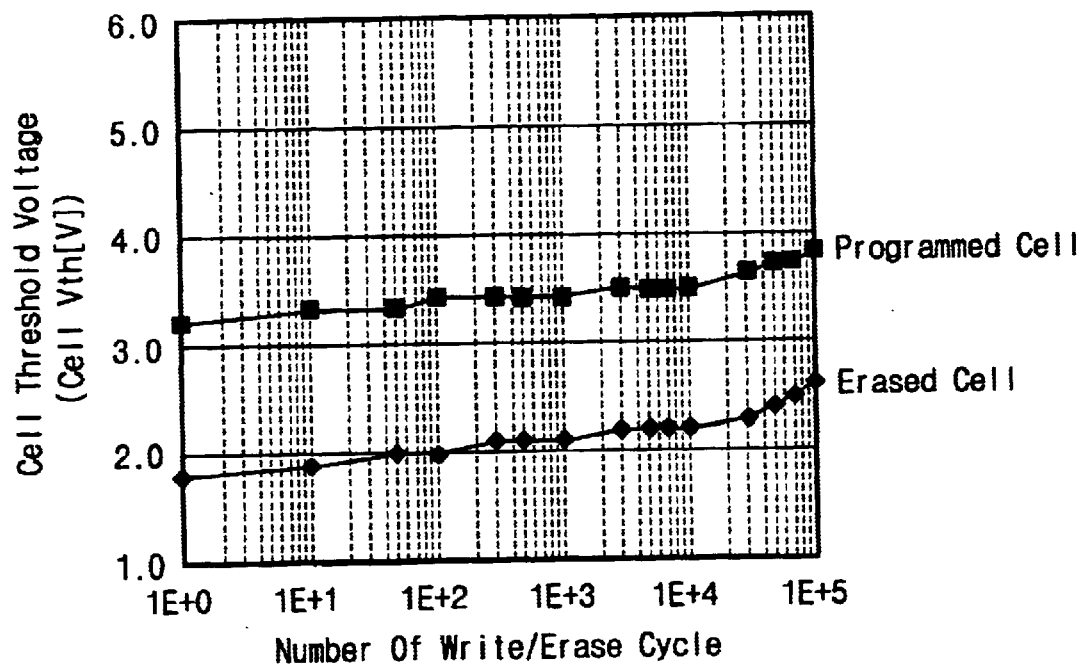
Figure 8C:
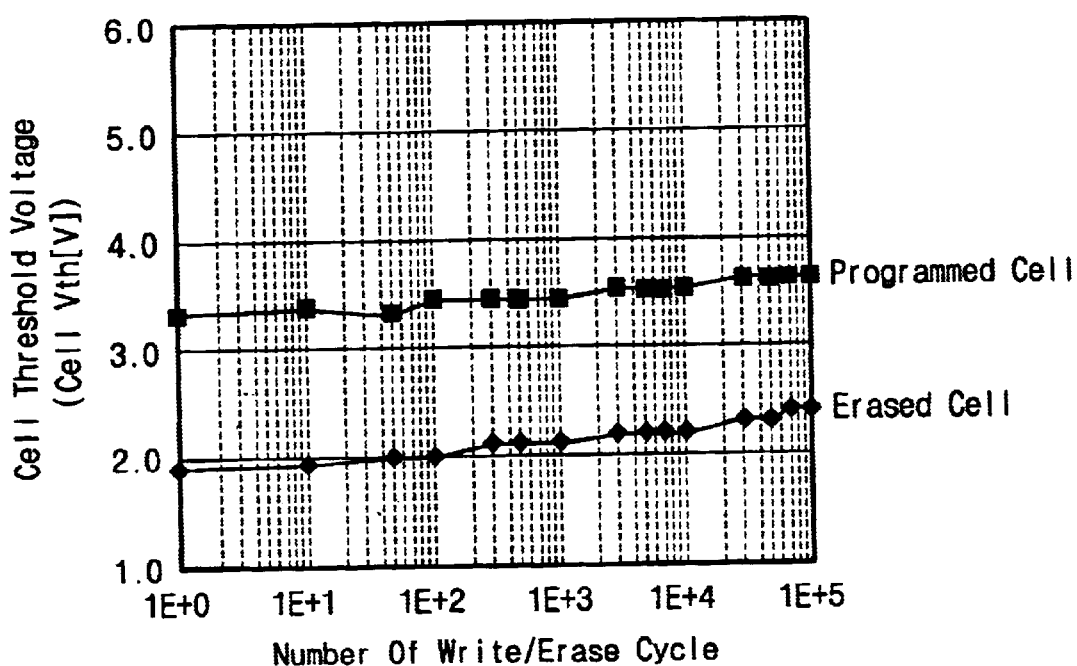

FIGS. 8A through FIG. 8C are graphs illustrating the relationship between an endurance characteristic of a memory cell and the number of write/erase cycles according to a conventional erase method and an erase method of the present invention, respectively. FIG. 8A shows an endurance characteristic of a memory cell according to a conventional erase method (i.e., "case 1"), FIGS. 8B and 8B show endurance characteristics of memory cell according to an erase method of the present invention ("case 2" and "case 3"), respectively. In each drawing, a traverse axis (X-axis) represents the number of write/erase cycles, and a longitudinal axis (Y-axis) represents a cell threshold voltage (volt). The threshold of the memory cell is a gate voltage when a 1.5V is applied to a drain region and a drain current is 1 $\mu$A.

FIGS. 8A–8C show that an endurance characteristic of a memory cell is improved from "case 1" through "case 2" to "case 3". That is, an endurance characteristic of a memory cell according to the present invention is better than that of the conventional erase method. This is because, in the present invention, electric fields, which are formed by a voltage difference between source and drain regions, generate implanting elements that are added toward a channel lateral surface, and a uniform erase is performed throughout the channel.

According to the present invention, SONOS EEPROM devices may be applied to N-channel devices, P-channel devices, and floating gate EEPROM devices. And, SONOS EEPROM devices do not need a separate pocket well for applying a voltage to a bulk region. Furthermore, in an N-channel EEPROM, a uniform hole injection is achieved throughout a channel to enhance a reliability of erase operation.

Thus, it is understood that while the various particular embodiments set forth herein have been described in detail, the present invention could be subject to various changes, substitutions, and alterations without departing from the spirit and scope of the invention. Accordingly, the present invention is intended to be limited only as defined by the appended claims.

What is claimed is:

1. A method for performing an erase operation in a non-volatile memory device comprising a bulk region of a first conductive type, spaced first and second impurity diffusion regions of a second conductive type formed in the bulk region, a charge storing layer formed between the first and the second impurity diffusion regions, and a conductive electrode formed on the charge storing layer, the method comprising the steps of:

applying a bulk voltage to the bulk region for a predetermined erase time;

applying a gate voltage to the conductive electrode for the predetermined erase time, the gate voltage being greater than or equal to the bulk voltage;

applying a first voltage to the first impurity diffusion region during the predetermined erase time, wherein the first voltage is greater than the gate voltage;

applying a second voltage to the second impurity diffusion region during the predetermined erase time, wherein the second voltage is greater than the gate voltage, wherein the first and second voltages are different; and switching the first and second voltages at least one time during the predetermined erase time such that the first voltage is applied to the second impurity region while the second voltage is applied to the first impurity region.

2. The method of claim 1, wherein data is stored in the charge storing layer through a tunnel oxide layer, a charge storing nitride layer, and a blocking oxide layer stacked in sequence.

3. The method of claim 1, wherein the first conductive type is P-type, and the second conductive type is N-type.

4. The method of claim 1, wherein the bulk voltage is about 0V.

5. The method of claim 1, wherein the first voltage ranges from about 2V to about 6V, and the second voltage is about 10V.

6. The method of claim 1, wherein both the gate voltage and the bulk voltage are about 0V.

7. A method for performing an erase operation in a memory cell comprising a bulk region of a first conductive type, spaced source and drain regions of a second conductive type formed in the bulk region, and a gate electrode formed between the source and drain regions, the method comprising the steps of:

applying a first voltage to the source region and a second voltage to the drain region for a portion of a predetermined erase time; and applying the second voltage to the source region and the first voltage to the drain region for a portion of the predetermined erase time.

8. The method of claim 7, wherein the first conductive type is P-type, and the second conductive type is N-type, and wherein a bulk voltage applied to the bulk region is about 0V, and a gate voltage applied to the gate electrode is greater than or equal to the bulk voltage.

9. The method of claim 8, wherein the first and the second voltages are greater than the gate voltage.

10. The method of claim 7, wherein the first voltage is in the range of about 2V to about 6V and the second voltage is about 10V.

11. The method of claim 7, wherein the second voltage is in the range of about 2V to about 6V and the first voltage is about 10V.

12. A method for performing an erase operation in a non-volatile memory device comprising a bulk region of a first conductive type, spaced source and drain regions of a second conductive type formed in the bulk region, and a gate electrode formed between the source and drain regions, the method comprising the steps of:

applying a first voltage and a second voltage to the source and drain regions, respectively, for a predetermined erase time;

applying a third voltage to the gate electrode, wherein the potential differences between the third voltage and the first and second voltages are sufficient to generate electric fields between the gate electrode and the source and drain regions to inject holes into the source and drain regions, respectively; and switching the first voltage to the drain region and the second voltage to the source region at least one time during the predetermined erase time.

13. The method of claim 12, further comprising the step of applying a fourth voltage to the bulk region, the fourth voltage being less than or equal to the third voltage.

14. The method of claim 12, wherein time for switching between the first voltage and the second voltage is variable in the predetermined erase time.

* * * * *